United States Patent
Linstadt

(10) Patent No.: US 9,268,632 B2
(45) Date of Patent: Feb. 23, 2016

(54) MEMORY DEVICE WITH ECC HISTORY TABLE

(75) Inventor: Eric Linstadt, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/822,603

(22) PCT Filed: Sep. 12, 2011

(86) PCT No.: PCT/US2011/051237
§ 371 (c)(1),
(2), (4) Date: Mar. 12, 2013

(87) PCT Pub. No.: WO2012/039983
PCT Pub. Date: Mar. 29, 2012

(65) Prior Publication Data
US 2013/0179751 A1    Jul. 11, 2013

Related U.S. Application Data

(60) Provisional application No. 61/386,103, filed on Sep. 24, 2010.

(51) Int. Cl.
*G06F 11/10*    (2006.01)
*G11C 16/26*    (2006.01)
*G11C 29/04*    (2006.01)

(52) U.S. Cl.
CPC ............ *G06F 11/10* (2013.01); *G06F 11/1048* (2013.01); *G11C 16/26* (2013.01); *G11C 2029/0411* (2013.01)

(58) Field of Classification Search
CPC . G06F 11/1004; G06F 11/1008; G06F 11/10; G06F 11/108; G06F 11/1417
USPC ............ 714/E11.036, 719, 758, 763–764, 714/769–771, 755, 786; 365/201; 711/114
See application file for complete search history.

(56) References Cited

U.S. PATENT DOCUMENTS

| | | | |
|---|---|---|---|
| 5,793,774 A * | 8/1998 | Usui et al. ..................... | 714/719 |
| 7,080,305 B2 | 7/2006 | Welbon et al. | |
| 7,254,743 B2 | 8/2007 | Iida et al. | |
| 7,447,936 B2 | 11/2008 | Shiota et al. | |
| 2008/0104480 A1* | 5/2008 | Tseng et al. .................. | 714/758 |
| 2008/0133994 A1* | 6/2008 | Oh ................. | 714/746 |
| 2008/0155370 A1* | 6/2008 | Kadomatsu ................... | 714/747 |
| 2008/0301524 A1 | 12/2008 | Horisaki et al. | |
| 2009/0031194 A1* | 1/2009 | Bellipaddy et al. .......... | 714/764 |
| 2009/0055680 A1 | 2/2009 | Honda et al. | |
| 2009/0327840 A1 | 12/2009 | Moshayedi | |
| 2010/0088557 A1 | 4/2010 | Weingarten et al. | |

(Continued)

OTHER PUBLICATIONS

International Preliminary Report on Patentability (Chapter I) dated Apr. 4, 2013 in International Application No. PCT/US2011/051237. 6 pages.

*Primary Examiner* — Guy Lamarre
(74) *Attorney, Agent, or Firm* — Lance Kreisman; Peninsula Patent Group

(57) ABSTRACT

A method of reading data from a memory device is disclosed. The method comprises accessing preexisting data from a location in the memory device in response to a read command and identifying an error in the preexisting data. The identified error is corrected for transmission as corrected data. Error information representing the identified error is stored while the preexisting data is retained in the location of the memory device in uncorrected form.

23 Claims, 10 Drawing Sheets

(56) References Cited

U.S. PATENT DOCUMENTS

| | | |
|---|---|---|
| 2010/0241929 A1 | 9/2010 | Song et al. |
| 2012/0131382 A1* | 5/2012 | Higeta .......................... 714/6.13 |
| 2014/0115419 A1* | 4/2014 | Ahn et al. ..................... 714/758 |

\* cited by examiner

MEMORY DEVICE WITH ECC HISTORY TABLE

CROSS-REFERENCE TO RELATED APPLICATIONS/TECHNICAL FIELD

Pursuant to 35 U.S.C. §365, this application claims priority from International Application No. PCT/US2011/051237, published as WO 2012/039983 A1 on Mar. 29, 2012, which claims priority from U.S. Provisional Application No. 61/386,103, filed Sep. 24, 2010 and entitled "MEMORY DEVICE WITH ECC HISTORY TABLE". International Application No. PCT/US2011/051237 and U.S. Provisional Application No. 61/386,103 are hereby incorporated by reference in their entirety.

The disclosure herein relates to memory systems and methods and more particularly to memory systems that employ error correction codes.

BACKGROUND

Error correction codes (ECC) are used in a variety of signaling applications to detect and correct errors relating to data transmission and storage. The codes generally provide redundancy to the original data so that, when the data is encoded via a particular ECC algorithm, a certain number of data errors may be identified and corrected upon decoding. The redundant portions of the encoded data may take the form of checksums, parity bits, or the like, depending on the type of ECC employed.

Memory systems have employed ECC to encode write data stored in a memory array. As the encoded data is accessed and decoded in response to a read operation, errors are detected and corrected. The corrected read data may then be transmitted back to the requesting device (such as a host or memory controller), and written back into the memory device as corrected data.

As memory density (through decreased device size and the storage of multiple bits per cell) and signaling rates increase, and with them, corresponding bit error rates, operations to re-write corrected data back into a given memory array may be expected to rise. Numerous re-writes may be problematic for memory devices that are susceptible to write endurance issues, such as flash or phase change memory devices. Moreover, numerous write operations to a flash or phase change array dissipate a significant amount of power.

BRIEF DESCRIPTION OF THE DRAWINGS

Embodiments of the disclosure are illustrated by way of example, and not by way of limitation, in the figures of the accompanying drawings and in which like reference numerals refer to similar elements.

DETAILED DESCRIPTION

Embodiments of a memory system, devices and related methods are disclosed. One method of reading data from a memory device involves accessing preexisting data from a location in the memory device in response to a read command and identifying an error in the preexisting data. The identified error is corrected for transmission as corrected data. Error information representing the identified error is stored while the preexisting data is retained in the memory device location in uncorrected form. By retaining the preexisting data, and storing the error information, the number of write operations to the memory device may be minimized. This, in turn, reduces any impact associated with potential write endurance issues and/or power dissipation constraints.

A further embodiment of a method for reading data includes accessing preexisting data from a location in the memory device in response to a read command and accessing error information representing whether an error exists in the preexisting data. A determination is made whether an error exists based on the error information. If an error exists, the preexisting data is processed to generate corrected data. The corrected data is then returned responsive to the read command while not overwriting the preexisting data with the corrected data.

In another embodiment, a memory device is disclosed. The memory device includes a memory array. The memory array has a first location to store preexisting data, and an error history location to store error information relating to the preexisting data. Sense circuitry responsive to a read request is provided to access the respective locations. Error detection circuitry selectively receives the corrected data based on the stored error information, the error detection circuitry to detect new errors in the corrected data.

In yet another embodiment, a memory system is disclosed. The memory system comprises a memory controller to issue a read request for data and a memory device coupled to the controller. The memory device includes an array of storage cells comprising a preexisting data region, and circuitry to return read data to the memory controller. Error storage circuitry stores error information for the array of storage cells, where the error information identifies known errors in the preexisting data. Circuitry to correct the data is provided where corrections to the preexisting data are made using the error information without overwriting the data stored in the storage cells.

Figure 1:
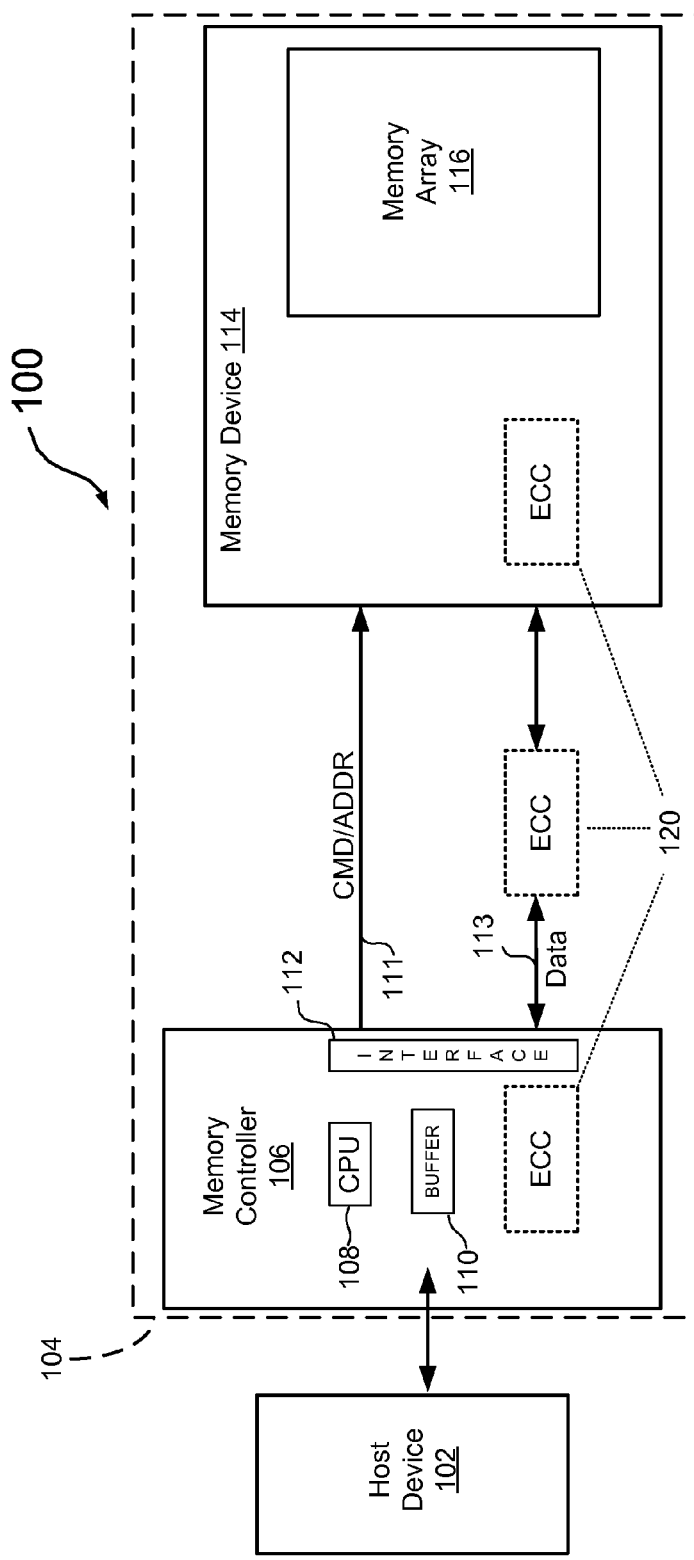
FIG. 1 illustrates a block diagram of an embodiment of a system including a memory subsystem.

Referring now to FIG. 1, one embodiment of a nonvolatile memory system, generally designated 100, comprises a host device 102 coupled to a memory subsystem 104. The memory subsystem employs a memory controller 106 that interfaces with one or more memory devices 114. For purposes of brevity, much of the description below focuses on so-called nonvolatile memory subsystems, such as flash or phase change random access memory. As used herein, the term "nonvolatile" refers to memory that retains data for an appreciable time after power loss, thereby enabling a host system to be powered off (power supplies fully discharged) and then back on (a power cycle) with a full expectation of data retention. Examples of non-volatile semiconductor memory technologies may include flash memory, phase change memory, resistance change memory, FRAM (ferroelectric RAM), MRAM (magnetic RAM) and other similar solutions. "Flash" memory includes both NAND and NOR core cell structures as well as floating gate and charge-trapping technologies (e.g. Silicon-Oxide-Nitride-Oxide-Silicon or "SONOS" technology.) Moreover, various effects from either aging or wear may lead to a semiconductor memory cell having progressively reduced retention interval, such that a particular memory may ultimately change in character from nonvolatile to volatile. It should be understood that other memory types, such as DRAM, SRAM, MRAM, RRAM, and so forth, may also employ the principles disclosed herein.

The host device 102 may be implemented using any processor or logic device, such as a complex instruction set computer (CISC) microprocessor, a reduced instruction set computing (RISC) microprocessor, a very long instruction word (VLIW) microprocessor, a processor implementing a combination of instruction sets, or other processor device. In one embodiment, for example, the processor may be implemented as a general purpose processor, such as a multi-core processor made by Intel Corporation, Santa Clara, Calif. The processor also may be implemented as a dedicated processor, such as a controller, microcontroller, embedded processor, a digital signal processor (DSP), a network processor, a media processor, a field programmable gate array (FPGA), and so forth.

The nonvolatile memory subsystem 104 of FIG. 1 may take several forms architecturally. For example, in one embodiment, the memory controller 106 and memory device 114 may each comprise discrete semiconductor chips interconnected by the command/address ADDR and data DATA busses 111 and 113. In other embodiments, the memory controller 106 may reside on the same chip occupied by the memory device 114. Yet other embodiments may employ the memory controller 106 as a circuit integrated on-chip with the host device 102. Further embodiments may utilize a processor or system-on-chip (SOC) that employs the host, controller, and memory device (with the memory array circuitry) on a single integrated circuit chip.

With continued reference to FIG. 1, in one embodiment the memory controller 106 is configured to support nonvolatile memory operations. In this capacity, the controller 106 may include a central processing unit CPU 108, buffer storage circuitry 110, and a memory interface 112 coupled to the one or more memory devices 114. The CPU 108 may be configured, for example, as a state machine to control the overall operation of the memory controller in response to read/write requests from the host 102. Read/write data for transfer between the host 102, memory controller 106 and memory device(s) 114 may be buffered temporarily by the buffer circuitry 110 to support adequate queuing of respective read/write operations. In addition to the basic state machine and buffering functions noted above, the controller 106 may also employ write-leveling circuitry responsive to a write-leveling algorithm to enhance the write endurance of the one or more memory devices 114. This may generally involve tracking the number of writes for various blocks within one or more memory arrays 116, and distributing write data to various page locations such that over time, each block has approximately the same number of writes as any other block.

Further referring to FIG. 1, in one embodiment, each memory device 114 comprises a nonvolatile memory integrated circuit device including a memory interface and one or more of the arrays 116 of nonvolatile memory cells. Generally speaking, the memory device 114 receives command/address information from the memory controller 106 to effect reading and writing of data there between. The respective command/address 111 and data busses 113 may interconnect the memory device(s) 114 to the controller 106. Further details regarding the memory device 114 are described below.

With continued reference to FIG. 1, in one embodiment, the memory controller 106 and memory device 114 exchange data that is susceptible to errors. The apparatus and methods described more fully below may employ various schemes to detect and/or correct for errors in the exchanged data. In a specific embodiment, the data is protected by an error correction code (ECC). This generally involves encoding the write data using appropriate ECC circuitry 120 to provide a level of redundancy adequate to determine and correct errors resulting either from data transmission, storage cell failures, or the like. The data encoding may be generated in accordance with one of many acceptable ECC algorithms including, for example, straightforward single-bit Hamming codes, to more sophisticated high-speed BCH (Bose, Ray-Chaudhuri and Hocquenghem) codes. Other ECC codes, such as Reed-Solomon codes, turbo codes, cyclic redundancy codes (CRC) and low density parity check (LDPC) codes may also be acceptable. As shown in FIG. 1, the ECC circuitry 120 (including encoding/decoding circuitry, XOR circuitry, and other support circuitry more fully described with respect to FIG. 2) may reside in the memory controller 106, memory device 114 or in the datapath 113 interposed between the two discrete components depending on the application. Further detail related to one embodiment of the ECC circuitry 120 is described below in connection with further detail regarding an embodiment of the memory device 114.

Figure 2:
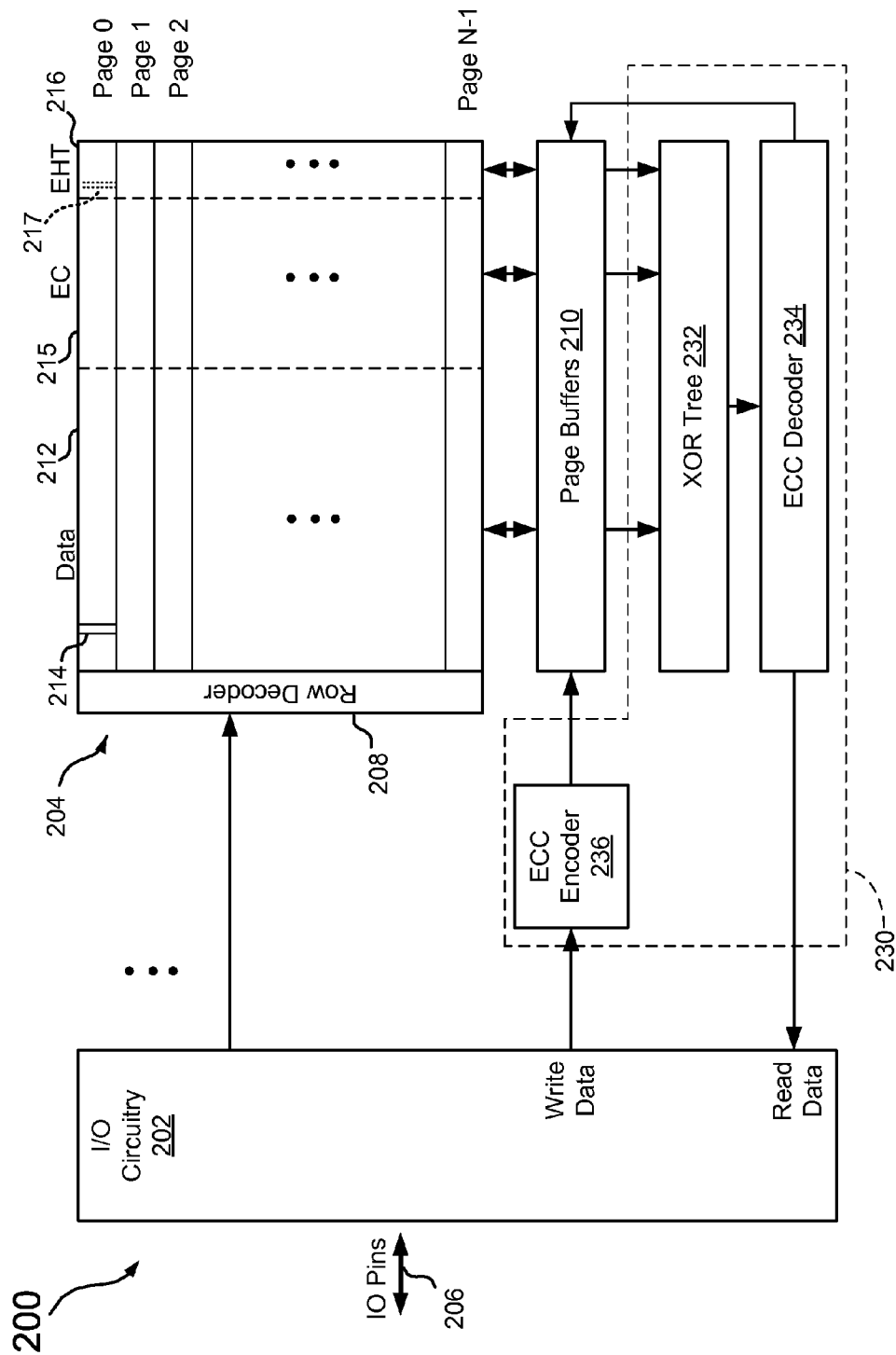
FIG. 2 illustrates an embodiment of a memory device that may be employed in the memory subsystem of FIG. 1.

FIG. 2 illustrates one embodiment of a nonvolatile memory device, generally designated 200, that may be utilized as the memory device. The device generally employs I/O circuitry 202 that provides an interface between the memory controller and one or more arrays 204 of memory cells in the memory device 200. For purposes of brevity, only one array is illustrated with the understanding that numerous arrays may be disposed in the memory device. The I/O circuitry 202 includes I/O pins 206 that transmit and receive data and related signals sufficient to carry out data transfer operations to and from the memory array 204.

With continued reference to FIG. 2, in one embodiment, the nonvolatile memory array 204 is organized into pages $Page_0$-$Page_{N-1}$ and employs row decoding circuitry 208 responsive to address and command signals from the I/O circuitry 202 to identify a desired wordline or page for access. Throughout the disclosure, the terms page and wordline are used interchangeably to refer to the smallest level of data access granularity provided by the memory device 204 during write and read operations. Page buffer circuitry 210 coupled to the array 204 employs sense amplifiers (not shown) to sense data bits located in the array corresponding to the decoded row address to provide access to the desired data (and parity information).

As noted above, the nonvolatile memory device 200 employs at least one memory array 204. In one embodiment, each page of the array may be organized into a data storage region or location 212 having a fixed number of data bit positions 214 corresponding to a certain number of data bytes. Each page also includes an error code location 215 that includes bit positions for error code such as a checksum or plurality of parity bits associated with the corresponding page of data bits. Other forms of ECC (e.g., a CRC) may also be used. Further storage may be provided in an error location 216 to store one or more bits that provide, in addition to a stored ECC code, information identifying discrepancies between the data and the stored ECC code. In a specific embodiment, described more fully below, the error location is referred to herein as an error history table EHT, to store error history information relating to each corresponding page of data. The EHT can store information representing changes in the data needed to bring the data into conformity with the ECC, or changes to the ECC only, or changes for both the data and the ECC (therefore correcting for known errors in both data and ECC).

In one embodiment, the error location 216 of the array 204 includes entries corresponding to each page, and may include, among other things, the bit locations of errors (bit fail addresses) detected during ECC decoding and evaluating of read data during read operations. The error location may alternatively (or additionally) include tag bits 217 (in phantom) indicating the validity of (or presence of an error in) the error history table information. For example, the tag bits may be used to quickly distinguish between the cleared (reset, empty, or error-free) state of the error history table information, and when errors have been detected at the location identified with cleared (reset) bit locations of errors (bit fail addresses). Tag bits may also be used to identify the quantity of error addresses that are valid and are stored in the error history table, facilitating the subsequent correction of multiple errors. The addresses of fails may include notations identifying one or more bit positions of data or parity information errors. Further detail regarding the organization and use of the error history information is described below. While a page-based organizational scheme is shown in FIG. 2 and described above for partitioning the data, parity bits, and error bit locations in each page, this is but one way to organize the information. Other embodiments may employ various other mappings such that the data, parity, and associated error history bits may not lie in the same physical page of the memory array 204. As an example, an entire page may be dedicated to storing the error history bits, with groups of bits corresponding to different pages of data and parity bits.

Further referring to FIG. 2, in one embodiment, the memory device 200 employs error correction code (ECC) circuitry 230 (in phantom). The on-chip ECC circuitry 230 includes an XOR tree circuit 232 that serves as an error history correction circuit, and has a plurality of inputs coupled to the page buffers 210 to receive preexisting data, parity data, and error history data pertaining to the same wordline. The XOR tree circuit 232 provides an XORed output to an ECC decoder 234, which decodes the read data word and feeds it to the I/O circuitry 202 as read data. Write data is initially encoded by an ECC encoder 236 that receives and encodes the write data to generate a code word having the original data bits with an appended set of redundant data bits, such as the parity bits. The encoder output feeds the page buffers 210 to, as a particular page address is fed to the row decoder 208, allow the write data to pass from the page buffers to the activated page, or wordline. In some embodiments, the ECC encoder 236 for write data may be disposed on the memory controller (not shown in FIG. 2), or proximate thereto in order to detect and correct for errors that may occur during transmission of the data over the datapath (not shown in FIG. 2).

In one embodiment, the ECC circuitry 230 cooperates with the error history portion 216 of the memory array 204 through operations more fully described below to effect reduced write operations to the memory device 200 resulting from error correction procedures. By reducing the number of page-level write operations, the memory device operational life may be extended from a write endurance perspective. Further, the reduction in page-level write operations corresponds to a similar reduction in power dissipation.

Figure 3A:
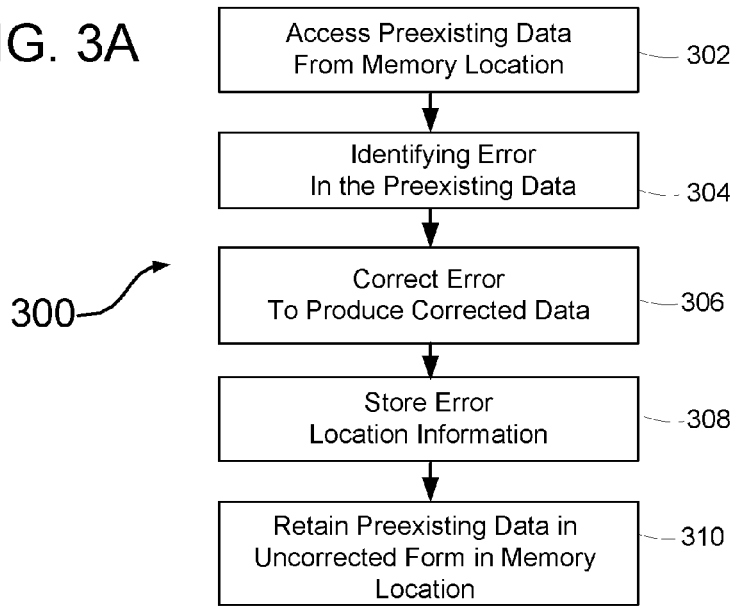
FIG. 3A illustrates a high-level flow diagram of one embodiment of a method of initially reading data from the memory device of FIG. 2.
Figure 3B:
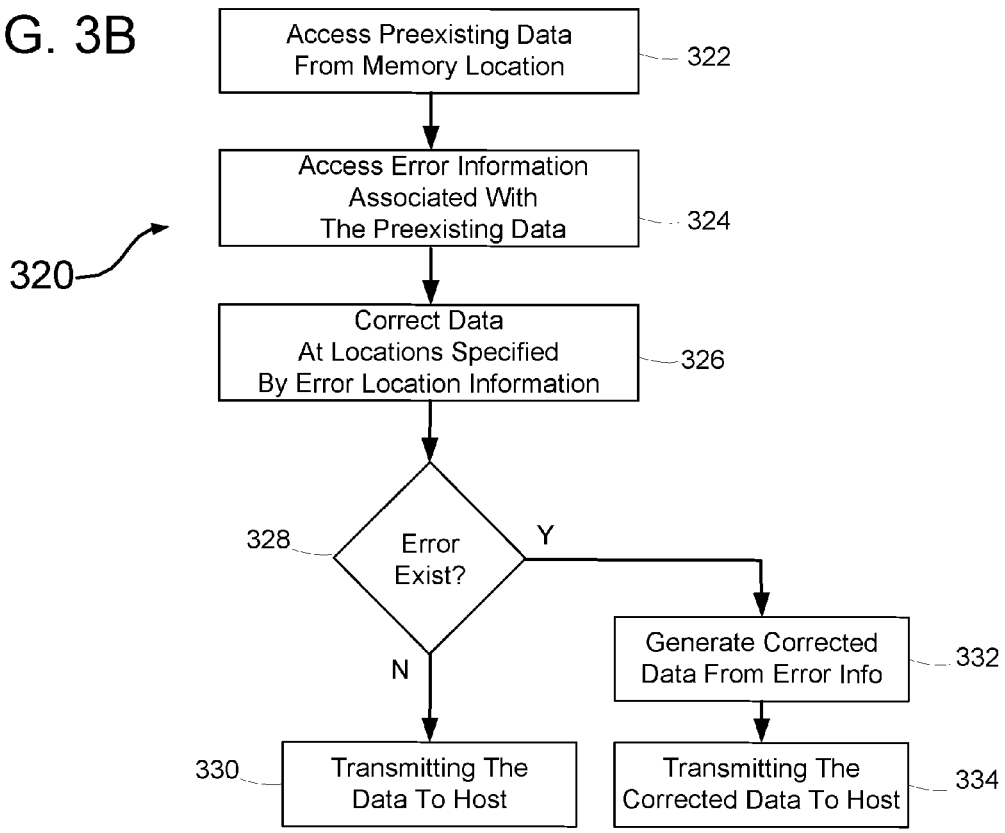
FIG. 3B illustrates a high-level flow diagram of a further embodiment of a method of subsequently reading data from the memory device of FIG. 2.

As noted above, certain forms of nonvolatile memory may experience write endurance issues over time, such that a memory array performs adequately for a threshold number of write operations before it begins to lose its data storage or retention characteristics. Referring now to FIGS. 3A and 3B, write operations may be minimized, thus extending the life of the memory device and correspondingly reducing power dissipation, by effectively carrying out read operations in accordance with the high-level method steps explained below.

Referring now to FIG. 3A, one embodiment of a method of reading data from a memory device involves first accessing preexisting data from a memory location (such as a page or addressed column), at 302. If the data has any errors, such as "hard" (persistent) or "soft" (transient) errors, the errors are identified, at step 304. As explained above, one way to identify the error(s) is through the use of error detecting codes. A detected error is then corrected, such as through an appropriate ECC algorithm, at 306, to produce corrected data. Error information such as the position of the error in the preexisting data is then stored in an error location in memory, at 308. By storing the error position in memory above and beyond the ECC, the preexisting data may be retained in uncorrected form in the memory location, at 310.

In a method similar to that outlined above, having memory to store errors associated with the preexisting data also allows for read operations that maintain the capability of the ECC in situations where a large number of errors occur. FIG. 3B illustrates a high-level method of reading data that begins by accessing preexisting data, at 322. Error information associated with the preexisting data is then accessed, at step 324, and the data corrected based on the error information generated, at 326. The corrected data may then be evaluated, such as by an ECC algorithm, to determine whether one or more additional errors are present in the corrected data, at step 328. If no additional errors are detected, then the corrected data may be transmitted to a host, at 330. Should one or more errors exist, then further corrected data may be generated through the ECC algorithm, at 332, and transmitted to the host, at 334.

Figure 4:
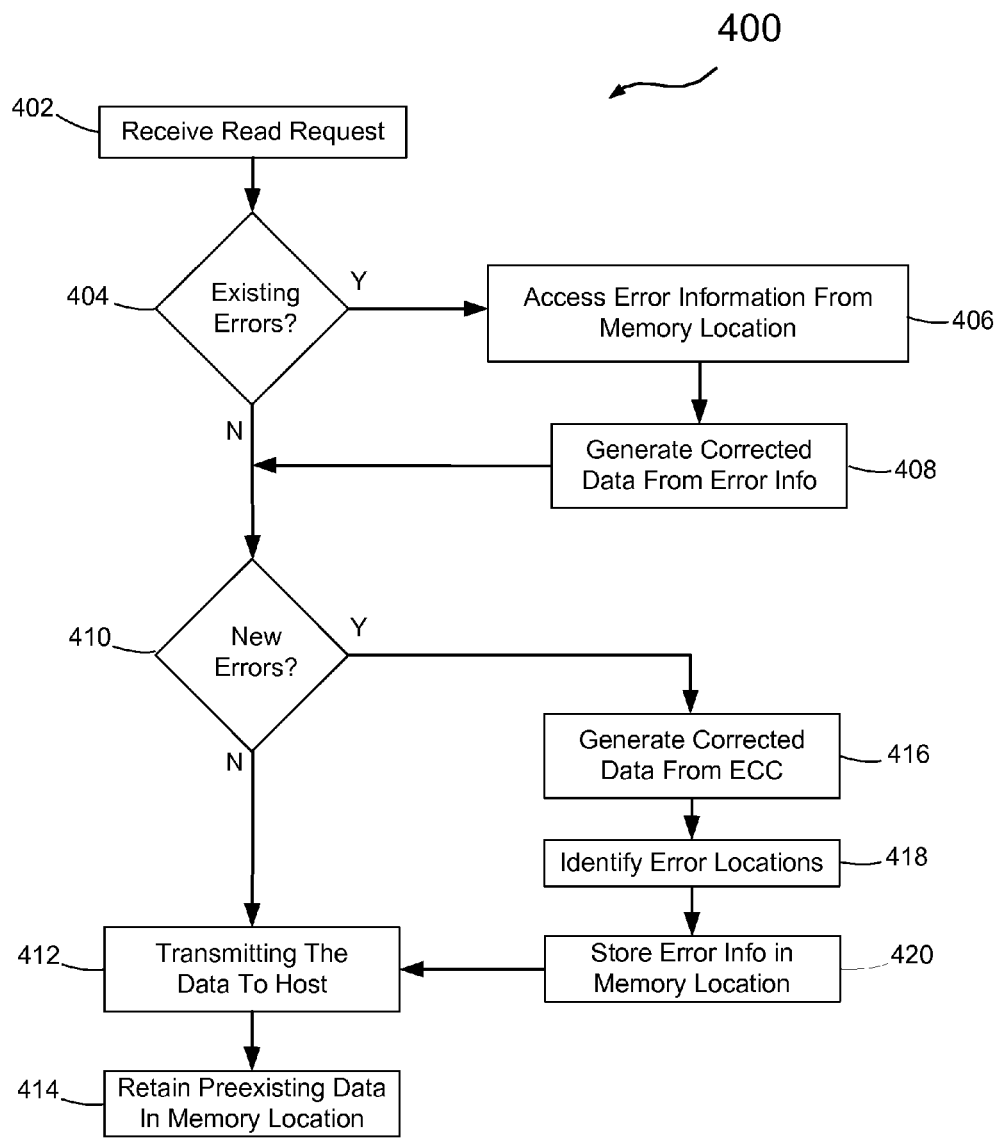
FIG. 4 illustrates a flow diagram of a method that ties together the methods of FIGS. 3A and 3B.

FIG. 4 illustrates a further example of reading data from a memory device that ties together the high-level steps outlined above, with some additional details. The steps below assume that the memory device writes preexisting data to the memory array consistent with, for example, an ECC algorithm (although any form of error detection or correction code may be used). With this in mind, read operations to access the ECC-encoded data begin with receiving a read request for preexisting data, at 402. The memory device accesses the encoded data, which may include locations for data bits and error code bits, and determines whether the preexisting encoded data has any associated preexisting errors, at 404. This is accomplished, in one embodiment, by accessing a separate memory location, at 406, which stores associated error information (if any) from previous read operations. Tag bits, if employed for the particular architecture, may be used to facilitate a quick determination as to whether any known preexisting errors exist. The memory then generates corrected data based on the error information, at 408. If the preexisting data had no preexisting errors, then the correction steps 406 and 408 may be bypassed.

Further referring to FIG. 4, the data is then evaluated, at 410, to determine whether the data has any new errors in addition to those stored in the error location discussed above. This may be done by comparing the data (corrected as appropriate) with the ECC (also corrected, if the design is such that the EHT enables correction for ECC errors as well as data errors). If there are no new errors, then the memory device transmits the data to the host, at 412, and the preexisting data retained in the accessed page (or other form of addressed location), at 414. If new errors exist, then the ECC correction circuitry identifies and corrects the errors, and in the process generates further corrected data, at 416. In one embodiment, the new error locations may be identified, at 418, and stored in new error locations to supplement the earlier-accessed error locations, at 420. The further corrected data may then be transmitted to the host, at 412, and the preexisting data retained in memory, without being overwritten by the corrected data, at step 414.

The method steps outlined above for reading data and parity information set forth generic methods for carrying out read operations utilizing ECC-protected data, without the need to rewrite the entire page of data into the array each time an error is detected and corrected. This significantly reduces the exposure of the array to numerous write operations, thus extending the life of the memory device, and correspondingly reducing the power expended thereby.

Figure 5:
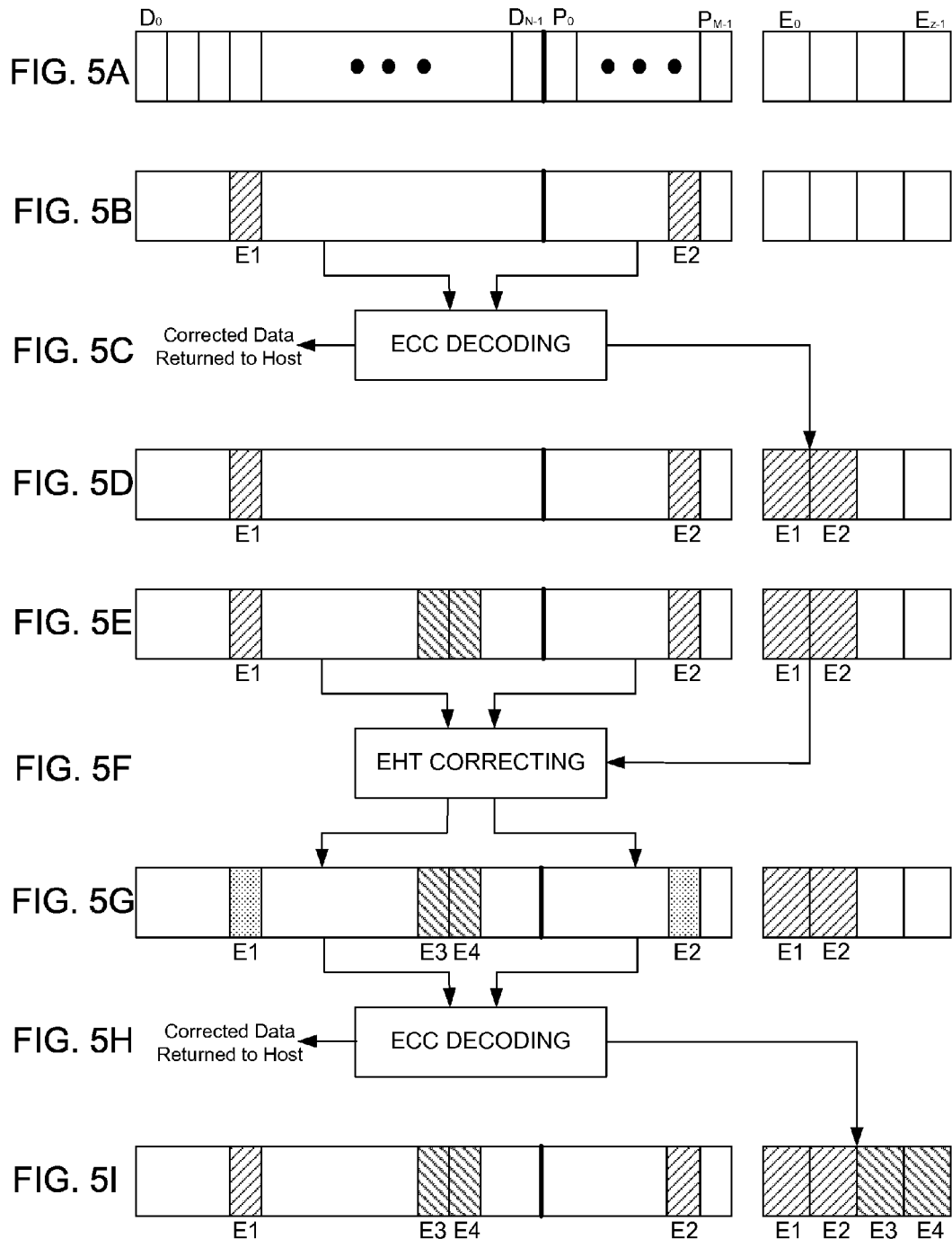
FIGS. 5A through 5I illustrate addressed data wordline including data bits, parity bits, and error history table bits as it sequences through a method of reading data according to one embodiment.
Figure 6:
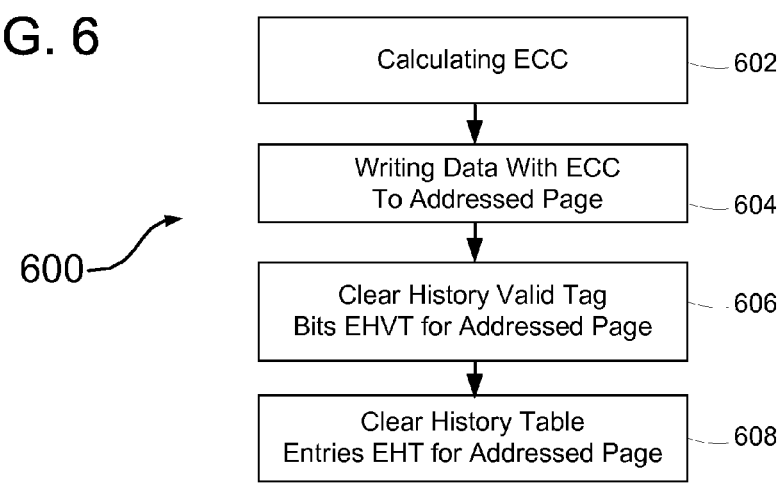
FIG. 6 illustrates a high-level flow diagram of one embodiment of a method of writing data to the memory device of FIG. 2.

FIGS. 5A through 5I, and FIG. 6 provide further details of method steps corresponding to the high-level read operations described above. In particular, FIGS. 5A-5I illustrate data structure diagrams showing sequentially how a given page of data, associated ECC (e.g., parity bits), and error history bits are processed in detail while FIG. 6 provides respective flow-charts corresponding to the data structure diagrams.

Referring now to FIG. 5A, a page or wordline is shown having a fixed set of data bits $D_0$-$D_{N-1}$, a set of parity bits $P_0$-$P_{M-1}$, and groups of error bits $E_0$-$E_{Z-1}$ representing, for example, addresses of failed data bits. Note that in this embodiment, "N" represents the number of data bits locations in a given page, M represents the number of error code (such as parity bits) locations assigned to the page for a given ECC strength, and Z represents the number of groups of error bits. In the context of the depicted embodiment, the EHT may have one or more "groups" for each memory location, with group having a sufficient number of bits to represent the bit locations of failed data and/or parity bits for a particular correction iteration. FIG. 5A shows a newly written page, such as "Page 0." As a newly written page, the groups of error history bits $E_0$-$E_{Z-1}$ will be clear of error information. FIG. 5B represents a situation where, upon a subsequent read request, one or more bits of data are newly corrupted, for example, a first error "E1" in the data ($D_0$-$D_{N-1}$,) and a second error "E2" in the ECC (i.e., within parity bits $P_0$-$P_{M-1}$) in this example. As there are no previous errors represented in the error history bits, the system proceeds to correct for errors and return error-free data to the host, as indicated in FIG. 5C. At the end of this process, as seen in FIG. 5D, the memory will store the uncorrected data (including ECC bits) as well as data in the error history sufficient to identify and correct errors "E1" and "E2."

When a subsequent read operation is later directed to the memory device, the state of the error history bits will be as seen in FIG. 5E, that is, with the error bits $E_0$-$E_{Z-1}$ exactly matching FIG. 5D. However, relative to FIG. 5D, it should be assumed that new errors have occurred in stored data or the ECC; in FIG. 5E, these new errors are represented by new (unlabeled) shaded bit positions within the data ($D_0$-$D_{N-1}$). Accordingly, per FIG. 5F, the read operation first corrects this data ($D_0$-$D_{N-1}$) for known errors (represented by indications for "E1" and "E2" in the EHT). The result of this error correcting operation is seen in FIG. 5G, where notably, the bit positions for errors "E1" and "E2" are seen with different shading, to denote the fact that these bits have been corrected; importantly, it should be noted that the data ($D_0$-$D_{N-1}$) is not overwritten in memory, i.e., the shaded data represents the fact that data is corrected in the memory I/O pipeline in preparation for being returned to the host. With preexisting errors corrected for to produce such "intermediate data," the memory device now compares the data with the ECC and discovers the new errors. These new errors are therefore labeled "E3" and "E4" in FIG. 5G. The system corrects these errors, for example, using the ECC data as had been corrected in the I/O pipeline, and it returns corrected data to the host. Finally, as seen in FIG. 5I, the system now leaves all of the preexisting data in memory (including errors "E1," "E2," "E3" and "E4") and it updates the EHT as seen in FIG. 5I to identify all errors.

FIG. 6 illustrates a brief block diagram illustrating steps involved in one embodiment of a method 600 of writing data to the memory device. In a specific embodiment, write data from the memory controller is fed to the input of the ECC encoder and undergoes encoding, or calculating of an ECC code word, via an ECC algorithm, at step 602. The write data and associated error code (such as parity bits) are then transmitted to the memory device and received by the I/O pins. Address and control information corresponding to the data passes to the row decoder to activate the appropriate page for access by the page buffer. The data and parity information loads into the page buffer and is subsequently passed (written) to the addressed page, at step 604, via a plurality of bit lines (not shown). Writing, or programming, the data into the page involves a series of programming/verifying operations that are well-known to those skilled in the art. In some embodiments, valid history tag bits corresponding to the written wordline may then be cleared or reset, at step 606. At step 608, history table entries corresponding to the newly written page may be cleared. This method may be followed each time a page experiences a write operation.

Figure 7A:
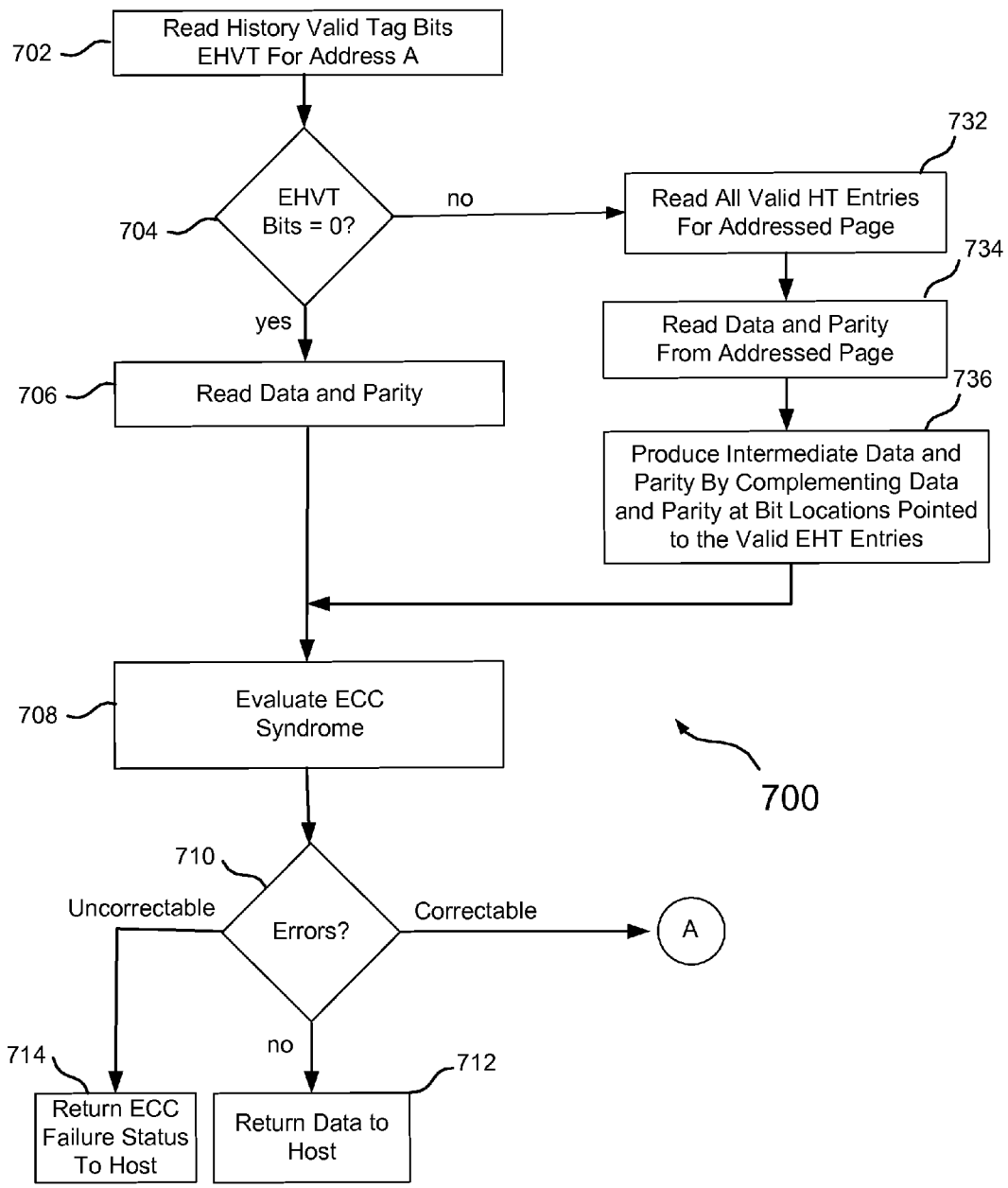
FIG. 7A illustrates a partial detailed flow diagram of method steps that correspond to the sequenced wordline shown in FIGS. 5A-5I.

When the memory device receives a read command to read the data having no previous errors at the addressed page, a method 700 illustrated by the steps in flowchart FIG. 7A are set into motion. The method includes first reading one or more error history valid tag (EHVT) bits for the addressed wordline, at step 702. This step checks to see whether any existing error bits have been programmed into the error history table as a result of prior read operations. For an initial read of newly written data, the valid tag bits will be 0, since no prior errors were ever detected (because there were no prior reads). In all circumstances where the valid tag bits are determined to be 0, at step 704, the data and parity bits on the addressed wordline may be read in accordance with a read operation, at step 706. The read operation involves decoding the data bits and parity bits by the ECC decoder, so that the data and/or parity bit errors may be detected and the error locations identified. The detecting and identifying includes evaluating an ECC syndrome generated as a result of decoding the data and parity bits, at step 708, and determining whether any detected errors are correctable or uncorrectable, at step 710. Generally, the correctable/uncorrectable determination is based on the number of errors detected, versus the "strength" of the ECC. More redundancy generally strengthens the ECC, but at a cost of increased storage space (for the additional parity bits for each page), and increased encoding/decoding time (seen as read latency during read data retrieval).

Figure 7B:
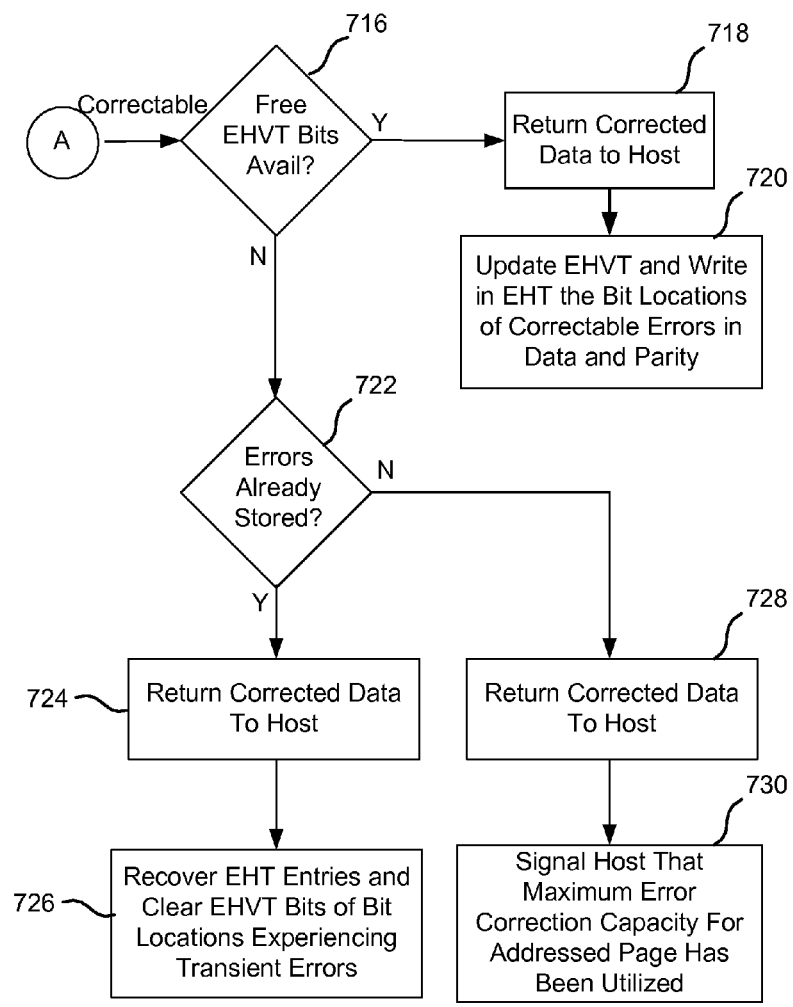
FIG. 7B illustrates a partial detailed flow diagram similar to FIG. 7A.

Further referring to FIG. 7A, should no new errors be detected, at step 710, the decoded data is forwarded to the host or memory controller, at step 712. At some point in time, one or more of the data bits, parity bits, or both may incur an error in state, often referred to as a "flipped" bit. In other words, a data bit that should have a state of logical "0" but instead has a state of logical "1" would be in error. If errors are detected, and found to be uncorrectable (such as where there are too many errors for the ECC coding to correct), an ECC failure status is returned to the host device, at step 714. Where new errors are detected, and correctable, the "flipped" data bits are corrected, and (as shown in FIG. 7B via bubble "A") an evaluation is performed to determine whether any additional EHVT bits and EHT entries are available, at step 716. The number of available bits may be based on several criteria, including the strength of the ECC, the code rate, and the amount of the memory array devoted to EHT storage. If bits are available, then the decoded intermediate data is returned to the host, at step 718. The EHVT is then updated, at step 720. This, in effect, "updates" the error history table to provide a roadmap to later correcting the errors without the need to immediately re-write the entire page.

With continued reference to FIG. 7B, in the event that free EHVT bits are unavailable, a determination is made at step 722 whether the locations of correctable errors are already stored in the EHT. If so, then the decoded intermediate data is returned to the host, at step 724, followed by a recovery of EHT entries and a clearing of EHVT bits of bit locations experiencing transient errors, at step 726. If the locations of the correctable errors are not already stored in the EHT, then the decoded intermediate data is returned to the host, at step 728, followed by forwarding a signal to the host that the maximum error correction capacity for the addressed wordline has been utilized, at step 730.

Returning to FIG. 7A, subsequent read operations to the same addressed wordline "Page 0" may involve additional steps while providing the ability to still correct any previously identified errors (such as E1 and E2). For instance, where an evaluation of the EHVT tag bits at step 704 results in a nonzero value, the valid history table entries that are associated with the data wordline "Page 0" are read into the EHT correction circuit, at step 732. The data bits and associated parity bits corresponding to the addressed wordline are also read into the EHT correction circuit, at step 734. Data and/or parity bits that are identified by the EHT entries (here E1 and E2) are corrected, at step 736, to generate intermediate data and parity bits. The intermediate data and parity bits are then fed to the ECC circuitry for a determination of whether any new errors exist, at steps 708 and 710, with additional steps following the error evaluation step as described above.

If, for example, a subsequent operation to the data wordline involves new write data, the method previously disclosed in reference to FIG. 6 may be followed, including resetting the EHVT bits for the wordline.

The memory device described above, and the associated method of reading data from the device, employ the error history table EHT in the context of on-chip storage space within one or more of the memory device arrays of memory cells. While this is convenient from a signaling protocol perspective, the error history information may be stored in any storage medium, such as a separate memory device mounted on a memory module or motherboard, a portion of embedded DRAM or SRAM on the memory controller 106, or discrete DRAM provided in the system. Changes to the methods described above to handle various storage scenarios for the error history table EHT may involve timing/synchronization steps to handle various time domain crossings, and provisions for handling any additional latency that may result from interfacing with the additional storage. Regardless of where the error history table resides, device longevity and power dissipation benefits resulting from a significant reduction in write operations to pages due to errors will be realized.

Additionally, the ECC circuitry described above was presented primarily in the context of a memory device. Other embodiments, as reflected in the high-level architectural layout of FIG. 1, may employ the ECC circuitry anywhere along the read data path. This includes the memory controller or any circuit interposed between the memory device and memory controller (such as a buffer chip).

Further, the memory device, system and associated methods described above may be employed, in one embodiment, with multiple modes of operation that may be selectable depending on the desired application. For example, in some applications where power and write endurance are lower-priority concerns, a first mode may be employed that avoids use of an error history table, instead handling errors to wordlines by re-writing corrected data to the page (in essence, re-writing the entire page) each time errors are detected in a read operation. A first mode may be beneficial in some instances where design tradeoffs for individual memory cell bits balance potentially reduced leakage or minimal latency with a reduction in endurance count or increased power. The first mode would provide a flexible alternative to a selectable second mode that employs steps consistent with the operations described above relating to an error-history table EHT. The modes may be programmable and/or dependent upon operating conditions such that programmable thresholds may cause the device to switch from operating in one mode to the other mode. Employing multiple modes also enables legacy controllers to interface with memory devices employing the selectable error history table functionality.

Figure 8:
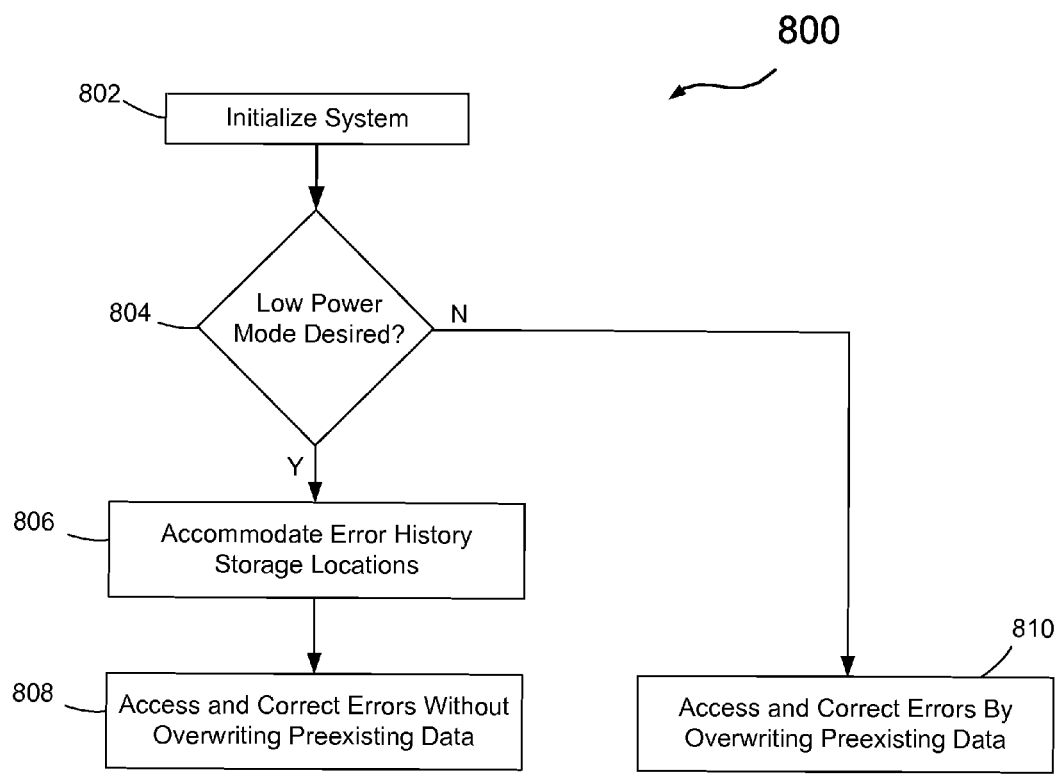
FIG. 8 illustrates a flow diagram of one embodiment of a method of reading data involving multiple modes of operation.

FIG. 8 sets forth a high-level flowchart illustrating one embodiment of a method of reading data where multiple modes of operation may be specified. The method begins by first initializing the system, at 802. The initialization process determines whether a first mode or second mode is desired, at step 804. This may be accomplished though use of a configurable register or other form of programming Selection of the first mode results in activating error history storage circuitry, at 806 (consistent with the embodiments described above). With the error history storage circuitry operative, read data may be accessed, corrected, and forwarded to a memory controller without overwriting the data, at 808. Should the first mode be selected, at 804, then read operations to access preexisting data involve accessing the preexisting data, correcting the data, forwarding the data to the memory controller, and overwriting the preexisting data in the memory device with the corrected data, at 810.

Figure 9:
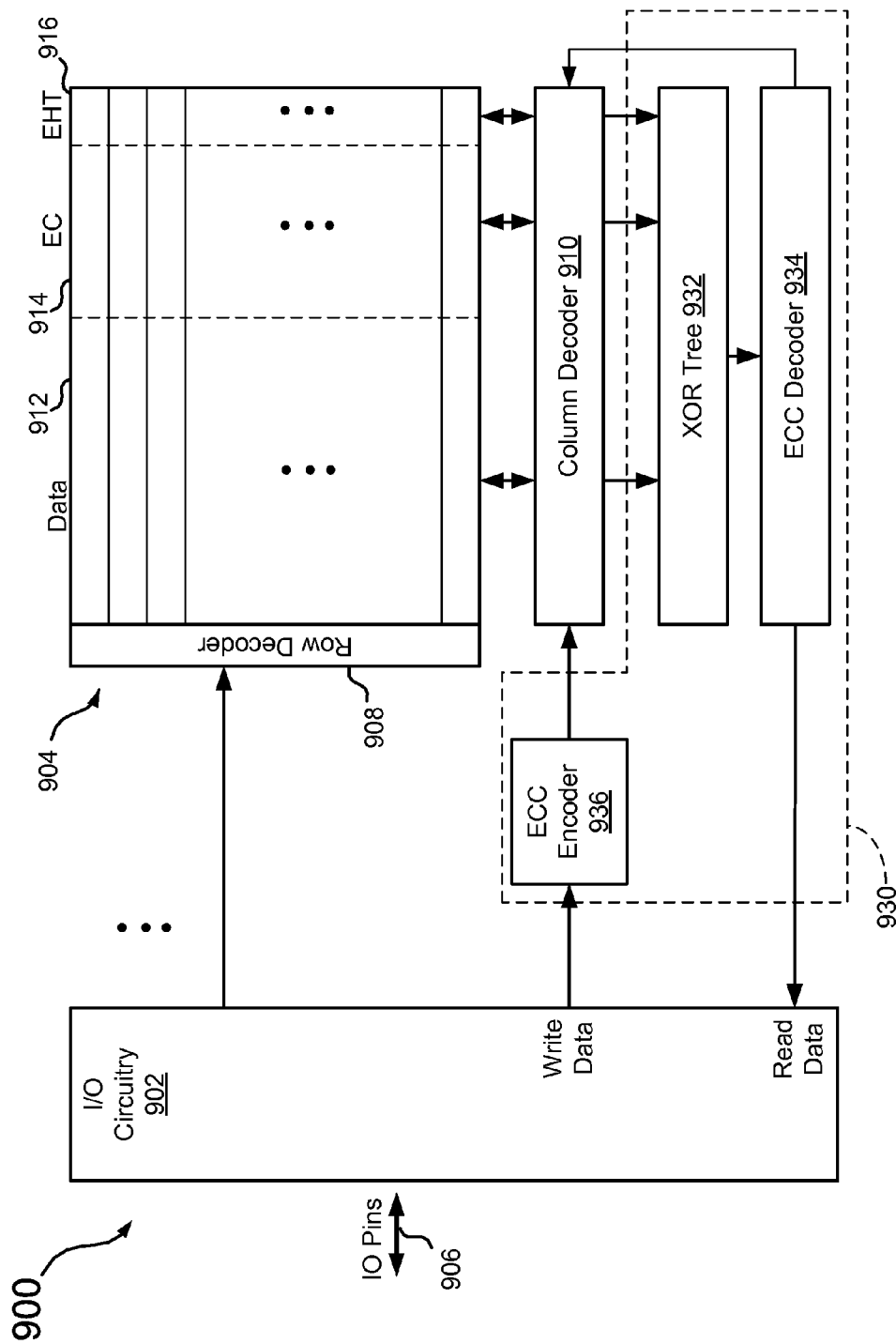
FIG. 9 illustrates a further embodiment of a memory device similar to FIG. 2.

While the methods and apparatus described above are couched in terms relating to nonvolatile memory embodiments, both volatile and nonvolatile forms of memory may equally benefit from the features described herein. FIG. 9 illustrates an embodiment of a memory device, generally designated 900, that employs memory cells that may be accessed on a column basis (and not just by page); for example, FIG. 9 may represent a volatile memory, such as DRAM, or a nonvolatile memory such as RRAM. Naturally, these examples are not limiting. The memory device includes I/O circuitry 902 that interfaces with a memory array 904 of memory cells arranged in word lines such as rows, and bit lines. Access to the rows and bit lines is provided by respective row and column decoders 908 and 910. The decoders generally respond to respective row and column address signals to retrieve data at selected memory locations corresponding to the row and column addresses. In one embodiment, the memory array is configured such that ECC-encoded data resides in addressable storage locations corresponding to data, at 912, error code (EC), at 914, and error history information (EHT), at 916.

Similar to previous embodiments, the memory device 900 may include ECC circuitry 930 in the form of an XOR tree 932 that receives column data from the column decoder 910, and an ECC decoder 934 to decode the retrieved column data to identify and correct errors in the data. An ECC encoder 936 may also be provided on the memory device to encode write data into the memory array. As is the case with previous embodiments, the ECC circuitry may reside completely or partly off the memory device 900, such as on a memory controller (not shown), or on a separate buffer chip (not shown).

Operation of the memory device of FIG. 9 generally corresponds to that described with respect to previously described embodiments. Generally, the memory device 900 receives read requests, and in response retrieves addressed data from the memory array. The data is evaluated for errors, either through an ECC algorithm, or by accessing the EHT to determine the extent of any previously detected errors. If errors are found, corrected data is generated and transmitted to the requestor. The detected errors (if any) may then be recorded in the EHT, and the originally retrieved data left uncorrected in the memory array. Further variations of this method may be employed consistent with any of the previously described method steps presented herein.

It should be appreciated that the techniques described herein are especially useful in connection with a memory device where data granularity is relatively small. For example, with a flash device, writing an error history table any time an error happens in an entire page may, depending on implementation, involve too many data writes (thus potentially detracting from device longevity). With an embodiment where data access is relatively granular (e.g., on a byte basis), error history tables can be allocated and updated on an as needed basis, thereby optimizing life cycle wear. That is to say, techniques described above, while useful to multiple memory forms (e.g., DRAM, flash and other devices) may be especially advantageous for memory forms where (a) life cycle wear or temporal degradation is an issue, and (b) where data granularity is low, e.g., nonvolatile forms such as RRAM, phase-change memory and similar memory forms.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A method of reading data from a non-volatile integrated circuit (IC) memory device, the method comprising:
   accessing preexisting data from a location in the non-volatile IC memory device in response to a read command, the preexisting data associated with a stored ECC code;
   identifying an error in the preexisting data based on supplemental error information from an error history table, the supplemental error information other than the stored ECC code;
   correcting the identified error to produce corrected data;
   storing error information representing the error; and
   retaining the preexisting data in the location of the memory device in uncorrected form for subsequent read accesses.

2. The method of claim 1 wherein the accessing comprises selecting a nonvolatile page of memory cells.

3. The method of claim 2 wherein the accessing comprises addressing one or more selected columns of memory locations.

4. The method of claim 3 wherein the identifying determines bit locations of errors in the preexisting data.

5. The method of claim 1 wherein the memory device comprises a flash memory device, and the location in the memory device comprises a page.

6. The method of claim 1 and further comprising:
   reaccessing the preexisting data in response to a subsequent read command;
   accessing the stored error information;
   correcting any identified errors in the preexisting data based on the stored error information;
   evaluating the reaccessed information to identify new errors; and
   updating the stored error information to include the new errors.

7. The method of claim 6 wherein the evaluating comprises decoding the corrected data in accordance with an ECC algorithm to detect the new errors.

8. The method of claim 1 wherein identifying an error comprises first evaluating the state of a tag bit associated with the error information.

9. A method of reading data from a non-volatile integrated circuit (IC) memory device, the method comprising:
   accessing preexisting data from a location in the non-volatile IC memory device in response to a read command, the preexisting data associated with a stored ECC code;
   accessing supplemental error information from an error history table representing whether an error exists in the preexisting data, the supplemental error information other than the stored ECC code;
   determining whether an error exists based on the supplemental error information; and
   if an error exists,
      processing the preexisting data to generate corrected data, and
      returning the corrected data responsive to the read command while not overwriting the preexisting data with the corrected data, the preexisting data available for subsequent read accesses.

10. The method according to claim 9 wherein the error information comprises bits that identify bit positions of one or more errors in the preexisting data.

11. The method according to claim 9 wherein the error information includes an error correction code (ECC), an error flag, and one or more error bits, and where the determining includes
   if the error flag is set, correcting the preexisting data using the one or more error bits to generate new data;
   if the new data is error free in reference to the ECC, providing the new data as the corrected data responsive to the read command; and
   if the new data includes a new error in reference to the ECC, correcting the new error to produce the corrected data, and updating the one or more error bits to reflect the new error, such that the preexisting data and the error bits together identify the corrected data.

12. The method according to claim 11 wherein updating the one or more error bits comprises writing the bit location of the new error.

13. The method according to claim 9 wherein the memory device comprises an integrated circuit memory chip, and the error information is accessed from off-chip.

14. A non-volatile integrated circuit (IC) memory device comprising:
   a memory array of non-volatile storage cells, the memory array having
      a first location to store preexisting data, the preexisting data associated with a stored ECC code,
      an error history location to store supplemental error information relating to the first location, the supplemental error information other than the stored ECC code;
   sense circuitry responsive to a read request to access the respective locations; and
   error detection circuitry to selectively receive corrected data based on the stored supplemental error information and the preexisting data, the error detection circuitry to detect new errors in the corrected data.

15. The memory device according to claim 14 wherein the memory device comprises a nonvolatile memory device.

16. The memory device according to claim 15 wherein the memory device comprises a flash memory device.

17. The memory device according to claim 15 wherein the memory device comprises a phase change memory device.

18. A memory system comprising:
   a memory controller to issue a read request for data;
   a non-volatile integrated circuit (IC) memory device coupled to the controller and including an array of non-volatile storage cells comprising a preexisting data region, the preexisting data region to store data associated with a stored ECC code;
   circuitry to return read data from the non-volatile IC memory device to the memory controller;

error storage circuitry including an error history table to store supplemental error information for the array of non-volatile storage cells, wherein the supplemental error information identifies known errors in data stored in the preexisting data region; and circuitry to correct the data stored in the preexisting data region using the supplemental error information without overwriting the data stored in the preexisting data region, wherein the data stored in the preexisting data region is available for subsequent read accesses.

19. The memory system according to claim 18 wherein the preexisting data region includes storage for data and error code associated with the data to detect errors in the data.

20. The memory system according to claim 18 wherein the memory device comprises a first discrete integrated circuit and the error storage circuitry resides off of the first discrete integrated circuit.

21. The memory system according to claim 20 wherein the memory controller comprises a second discrete integrated circuit device, and the error storage circuitry resides in the second discrete integrated circuit device.

22. The memory system according to claim 18 wherein the circuitry to correct the data resides on the memory device.

23. The memory system according to claim 18 wherein the circuitry to correct the data resides on the memory controller.

* * * * *